(12) United States Patent
Sundaresan et al.

(10) Patent No.: US 6,747,314 B2
(45) Date of Patent: Jun. 8, 2004

(54) METHOD TO FORM A SELF-ALIGNED CMOS INVERTER USING VERTICAL DEVICE INTEGRATION

(75) Inventors: Ravi Sundaresan, San Jose, CA (US); Yang Pan, Singapore (SG); James Yong Meng Lee, Singapore (SG); Ying Keung Leung, Hong kong (HK); Yelehanka Ramachandramurthy, Singapore (SG); Jia Zhen Zheng, Singapore (SG); Lap Chan, San Francisco, CA (US); Elgin Quek, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/242,483

(22) Filed: Sep. 12, 2002

(65) Prior Publication Data

US 2003/0075758 A1 Apr. 24, 2003

Related U.S. Application Data

(62) Division of application No. 09/981,438, filed on Oct. 18, 2001, now Pat. No. 6,461,900.

(51) Int. Cl.$^7$ .......................... H01L 29/76; H01L 29/94; H01L 27/12
(52) U.S. Cl. ..................... 257/330; 257/351; 257/350; 257/347; 257/329
(58) Field of Search ................................ 257/328–332, 257/350–351, E21.632

(56) References Cited

U.S. PATENT DOCUMENTS

| | | | |
|---|---|---|---|
| 5,072,276 A | * 12/1991 | Malhi et al. | 257/372 |
| 5,285,093 A | 2/1994 | Lage et al. | 257/332 |

(List continued on next page.)

OTHER PUBLICATIONS

S. Wolf, "Silicon Processing for the VLSI Era", vol. 2–13 "Process Integration", 1990 (ISBN 0–961672–4–5), Lattice Press, Sunset Beach, California (USA), Chapter 6, pp. 368–370.*

IBM Technical Disclosure Bulletin, May 1985, pp. 7046–7048, "CMOS Inverter Structure".

*Primary Examiner*—Nathan J. Flynn
*Assistant Examiner*—Johannes P. Mondt
(74) *Attorney, Agent, or Firm*—George O. Saile; Rosemary L. S. Pike; Douglas R. Schnabel

(57) ABSTRACT

A method to form a closely-spaced, vertical NMOS and PMOS transistor pair in an integrated circuit device is achieved. A substrate comprise silicon implanted oxide (SIMOX) wherein an oxide layer is sandwiched between underlying and overlying silicon layers. Ions are selectively implanted into a first part of the overlying silicon layer to form a drain, channel region, and source for an NMOS transistor. The drain is formed directly overlying the oxide layer, the channel region is formed overlying the drain, and the source is formed overlying the channel region. Ions are selectively implanted into a second part of the overlying silicon layer to form a drain, channel region, and source for a PMOS transistor. The drain is formed directly overlying the oxide layer, the PMOS channel region is formed overlying the drain, and the source is formed overlying the channel region. The PMOS transistor drain is in contact with said NMOS transistor drain. A gate trench is etched through the NMOS and PMOS sources and channel regions. The gate trench terminates at the NMOS and PMOS drains and exposes the sidewalls of the NMOS and PMOS channel regions. A gate oxide layer is formed overlying the NMOS and PMOS channel regions and lining the gate trench. A polysilicon layer is deposited and etched back to form polysilicon sidewalls and to thereby form gates for the closely-spaced, vertical NMOS and PMOS transistor pair.

11 Claims, 8 Drawing Sheets

U.S. PATENT DOCUMENTS

| | | | |
|---|---|---|---|
| 5,308,778 A | 5/1994 | Fitch et al. | 437/40 |
| 5,480,838 A | 1/1996 | Mitsui | 437/203 |
| 5,547,893 A * | 8/1996 | Sung | 437/52 |
| 5,578,850 A * | 11/1996 | Fitch et al. | 257/329 |
| 5,581,101 A * | 12/1996 | Ning et al. | 257/347 |
| 5,641,694 A | 6/1997 | Kenney | 438/156 |
| 5,723,370 A | 3/1998 | Ning et al. | 438/156 |
| 5,757,038 A | 5/1998 | Tiwari et al. | 257/192 |
| 5,777,347 A * | 7/1998 | Bartelink | 257/24 |
| 6,242,775 B1 * | 6/2001 | Noble | 257/330 |
| 6,566,682 B2 * | 5/2003 | Forbes | 257/51 |

* cited by examiner

METHOD TO FORM A SELF-ALIGNED CMOS INVERTER USING VERTICAL DEVICE INTEGRATION

This is a division of patent application Ser. No. 09/981,438, filing date Oct. 18, 2001, now U.S. Pat. No. 6,461,900, Method To Form A Self-Aligned Cmos Inverter Using Vertical Divice Integration, assigned to the same assignee as the present invention.

BACKGROUND OF THE INVENTION (1) Field of the Invention

The invention relates to a method of fabricating semiconductor devices, and more particularly, to the fabrication of high packing density, vertical CMOS devices in the manufacture of an integrated circuit device.

(2) Description of the Prior Art

In current CMOS sub-micron technology, MOS transistors are formed horizontally across the surface of the semiconductor substrate. Such technology requires very tight control of the polysilicon line width critical dimension (CD). To achieve this precision, lithography and etch techniques must constantly be improved and are, in fact, limiting further process scaling.

A second approach to CMOS integration is to fabricate the transistor structures vertically into the semiconductor substrate. The footprint, or surface area requirement, for each transistor or logic device can be reduced by using the depth of the substrate. Of particular importance in such vertical integration schemes are issues such as metal interconnection, or wiring, process complexity, self-alignment, and compatibility with existing process techniques.

Several prior art approaches disclose methods to form vertical devices in the semiconductor substrate. U.S. Pat. No. 5,285,093 to Lage et al teaches a memory cell having a trench structure. A six layer stack of alternating p-type and n-type silicon is cross-sectioned by a trench. A layer of oxide is deposited. A polysilicon layer is deposited and forms a common gate overlying the p-type and n-type layers exposed by the trench. A memory device is constructed using this structure. U.S. Pat. No. 5,641,694 to Kenney discloses a method to form a vertical transistor and memory cell. A trench is etched through a stack of p-type and n-type layers. Additional epitaxial layers are grown inside the trench to form the transistor nodes. IBM Technical Disclosure Bulletin, May 1985, pp. 7046–7048 teaches a method to form a latch-up resistant CMOS inverter device. An n-channel transistor is formed at the bottom of a trench. A p-channel transistor is formed laterally, at the substrate surface, between trenches. U.S. Pat. No. 5,723,370 to Ning et al discloses a method to form vertical CMOS devices on a trench sidewall. The method does not take advantage of buried layers. Trenches are etched into the semiconductor substrate after formation of STI. Polysilicon is then deposited in the trench bottom. The polysilicon is then selectively ion implanted to form p-type and n-type regions. Gate oxide is deposited on the trench sidewalls. Ions are implanted, using an angled implantation technique, into the sidewalls of the trench to form channel regions. Additional levels of polysilicon and oxide are deposited into the trench to build up devices. U.S. Pat. No. 5,308,778 to Fitch et al discloses a method to form vertical transistors and logic gates inside of trenches. A stack of dielectric and polysilicon is formed overlying the substrate. A trench is etched through the stack. A diffusion region is formed at the trench bottom. Gate oxide is grown on the exposed polysilicon of the sidewalls. Doped silicon regions are then grown by epitaxy on the inside of the trench to thereby form the drain, channel, and source regions. U.S. Pat. No. 5,757,038 to Tiwari et al teaches a method to form ultra-thin channel FET devices. A three-layer stack is epitaxially grown overlying the substrate. A pillar structure is progressively formed by etching. U.S. Pat. No. 5,480,838 to Mitsui teaches a method to form a double-gate MIS transistor. Pillars are formed by etching into the semiconductor substrate. Ion implantation is used to form source and drain regions.

SUMMARY OF THE INVENTION

A principal object of the present invention is to provide an effective and very manufacturable method of fabricating closely-spaced, CMOS inverters in the manufacture of integrated circuit devices.

A further object of the present invention is to provide a method to fabricate closely-spaced, CMOS inverters by forming vertical NMOS and PMOS transistors.

A yet further object of the present invention is to provide a method to fabricate vertical NMOS and PMOS transistors in a silicon implanted oxide substrate.

Another yet further object of the present invention is to fabricate vertical CMOS transistor using a trench to separate the NMOS and PMOS devices and to provide access to the common drain of the inverter pair and the sidewalls of the channel regions.

Another yet further object of the present invention is to connect the CMOS inverter pair using minimal area and utilizing self-aligned silicide (salicide) to reduce contact resistance.

Another object of the present invention is to achieve a novel, closely-spaced, CMOS inverter device using existing processes technology combined in a unique arrangement.

In accordance with the objects of this invention, a method to form a closely-spaced, vertical NMOS and PMOS transistor pair in an integrated circuit device is achieved. A substrate comprises silicon implanted oxide wherein an oxide layer is sandwiched between underlying and overlying silicon layers. Ions are selectively implanted into a first part of the overlying silicon layer to form a drain, channel region, and source for an NMOS transistor. The drain is formed directly overlying the oxide layer, the channel region is formed overlying the drain, and the source is formed overlying the channel region. Ions are selectively implanted into a second part of the overlying silicon layer to form a drain, a channel region, and a source for a PMOS transistor. The drain is formed directly overlying the oxide layer, the PMOS channel region is formed overlying the drain, and the source is formed overlying the channel region. The PMOS transistor drain is in contact with said NMOS transistor drain. A gate trench is etched through the NMOS and PMOS sources and channel regions. The gate trench terminates at the NMOS and PMOS drains and exposes the sidewalls of the NMOS and PMOS channel regions. A gate oxide layer is formed overlying the NMOS and PMOS channel regions and lining the gate trench. A polysilicon layer is deposited overlying the gate oxide layer. The polysilicon layer is etched back to form polysilicon sidewalls and to thereby form gates for the closely-spaced, vertical NMOS and PMOS transistor pair in the manufacture of the integrated circuit device.

Also in accordance with the objects of this invention, a closely-spaced, vertical NMOS and PMOS transistor pair is achieved comprising, first, a substrate comprising silicon implanted oxide wherein an oxide layer is sandwiched between underlying and overlying silicon layers. A vertical NMOS transistor is in the overlying silicon layer. The vertical NMOS transistor comprises, first, a drain overlying the oxide layer. A channel region overlies the drain. A source overlies the channel region. A gate trench exposes a top surface of the drain and a vertical surface of the channel region. Finally, a gate comprises a polysilicon sidewall spacer adjacent to the vertical surface of the channel region with a gate oxide layer therebetween. Finally, a vertical PMOS transistor is in the overlying silicon layer. The PMOS transistor comprises, first, a drain overlying the oxide layer. The drain contacts the vertical NMOS transistor drain. A channel region overlies the drain. A source overlies the channel region. A gate trench exposes a top surface of the drain and a vertical surface of the channel region. Finally, a gate comprises a polysilicon sidewall spacer adjacent to the vertical surface of the channel region with a gate oxide layer therebetween.

BRIEF DESCRIPTION OF THE DRAWINGS

In the accompanying drawings forming a material part of this description, there is shown.

DESCRIPTION OF THE PREFERRED EMBODIMENTS

The method of the present invention is applied to the formation of a CMOS inverter pair in a substrate. It should be clear to those experienced in the art that the present invention can be applied and extended without deviating from the scope of the present invention. In addition, the device of the present invention can be altered and extended without deviating from the scope of the present invention.

Figure 1:
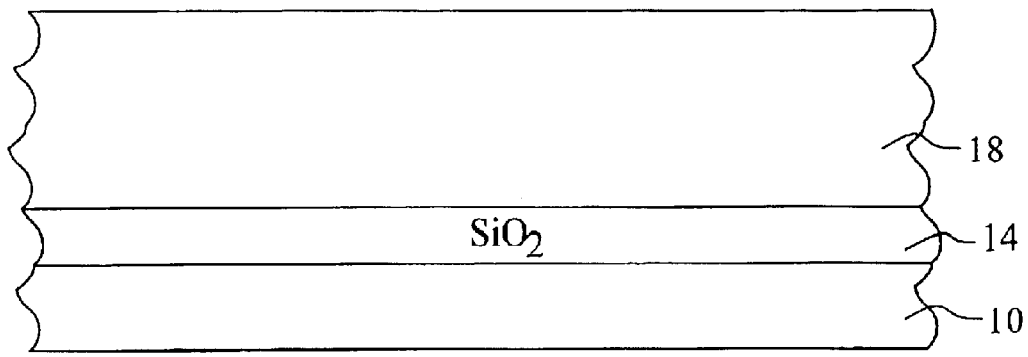
FIGS. 1 through 12 schematically illustrate in cross-sectional representation of the preferred embodiment of the present invention.

Referring now more particularly to FIG. 1, there is illustrated a cross-section of a partially completed integrated circuit device of the preferred embodiment. Several important features of the present invention are illustrated. A substrate 10, 14, and 18, is provided. The substrate 10, 14 and 18, preferably comprises a silicon implanted oxide (SIMOX) wafer. The SIMOX wafer comprises an underlying silicon layer 10, an oxide layer 14, and an overlying silicon layer 18. The oxide layer 14 preferably comprises silicon dioxide having a thickness of between about 500 Angstroms and 1,500 Angstroms. The overlying silicon layer 18 serves as the substrate for the CMOS inverter device. This configuration of silicon on isolation (SOI) allows the devices so formed to be electrically isolated from the underlying silicon layer 10. The overlying silicon layer 18 preferably comprises a thickness of between about 2,000 Angstroms and 3,000 Angstroms. The overlying silicon layer 18 preferably has a resistivity of between about 6 Ohms-cm and 9 Ohms-cm.

Figure 2:
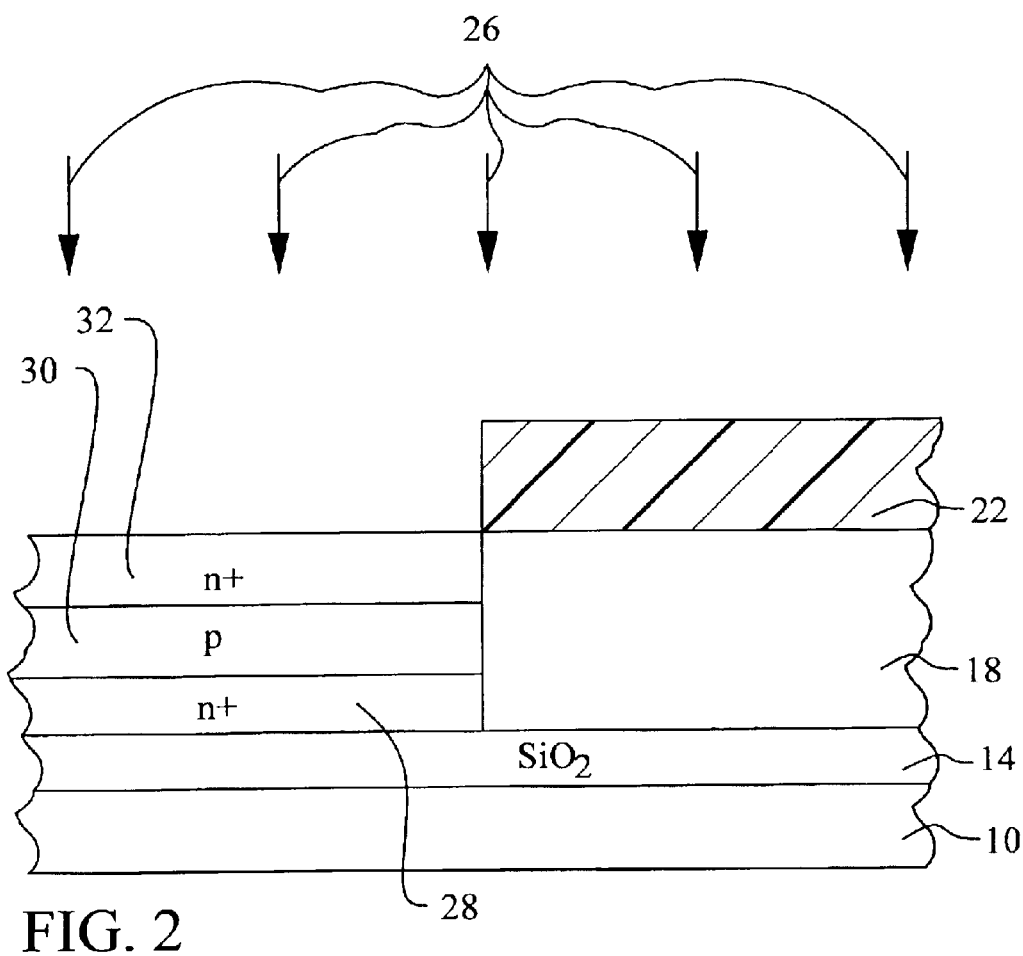

Referring now to FIG. 2, ions are selectively implanted 26 into the overlying silicon layer 18 to form a drain 28, a channel region 30, and a source 32, for the planned NMOS transistor. The overlying silicon layer 18 is first masked so that only the part of the overlying silicon layer 18 where the NMOS transistor is formed receives the implantation 26. A photoresist layer 22 may by applied and patterned using a conventional exposure and development process. The ion implantation preferably comprises a series of implantation steps using three recipes. In the drain recipe, ions are implanted 26 deeply into the overlying silicon layer 18 to form the n+ drain 28 just overlying the oxide layer 14. The drain ion implantation 26 preferably comprises implanting arsenic ions at an energy of between about 220 KeV and 500 KeV and a dose of between about $3 \times 10^{15}$ ions/cm$^2$ and $4 \times 10^{15}$ ions/cm$^2$. The NMOS transistor drain 28 so formed preferably comprises a thickness of its portion along its junction of between about 900 and 1,000 Angstroms and a concentration of between about $1 \times 10^{20}$ ions/cm$^3$ and $1 \times 10^{21}$ ions/cm$^3$.

In the NMOS channel region recipe, ions are implanted 26 into the overlying silicon layer 18 to form the p-type channel region 30 overlying the drain 28. The NMOS transistor channel region 30 so formed preferably comprises a thickness of between about 500 and 1,000 Angstroms and a concentration of between about $1 \times 10^{17}$ ions/cm$^3$ and $5 \times 10^{18}$ ions/cm$^3$.

In the NMOS source recipe, ions are shallowly implanted 26 into the overlying silicon layer 18 to form the n+source 32 overlying the channel region 30. The source ion implantation 26 preferably comprises implanting arsenic ions at an energy of between about 45 KeV and 70 KeV and a dose of between about $3 \times 10^{15}$ ions/cm$^2$ and $4 \times 10^{15}$ ions/cm$^2$. The NMOS transistor source 32 so formed preferably comprises a thickness of between about 800 Angstroms and 1,000 Angstroms and a concentration of between about $1 \times 10^{20}$ ions/cm$^3$ and $1 \times 10^{21}$ ions/cm$^3$. Following the ion implantation steps, the photoresist layer 22 is stripped away.

Figure 3:
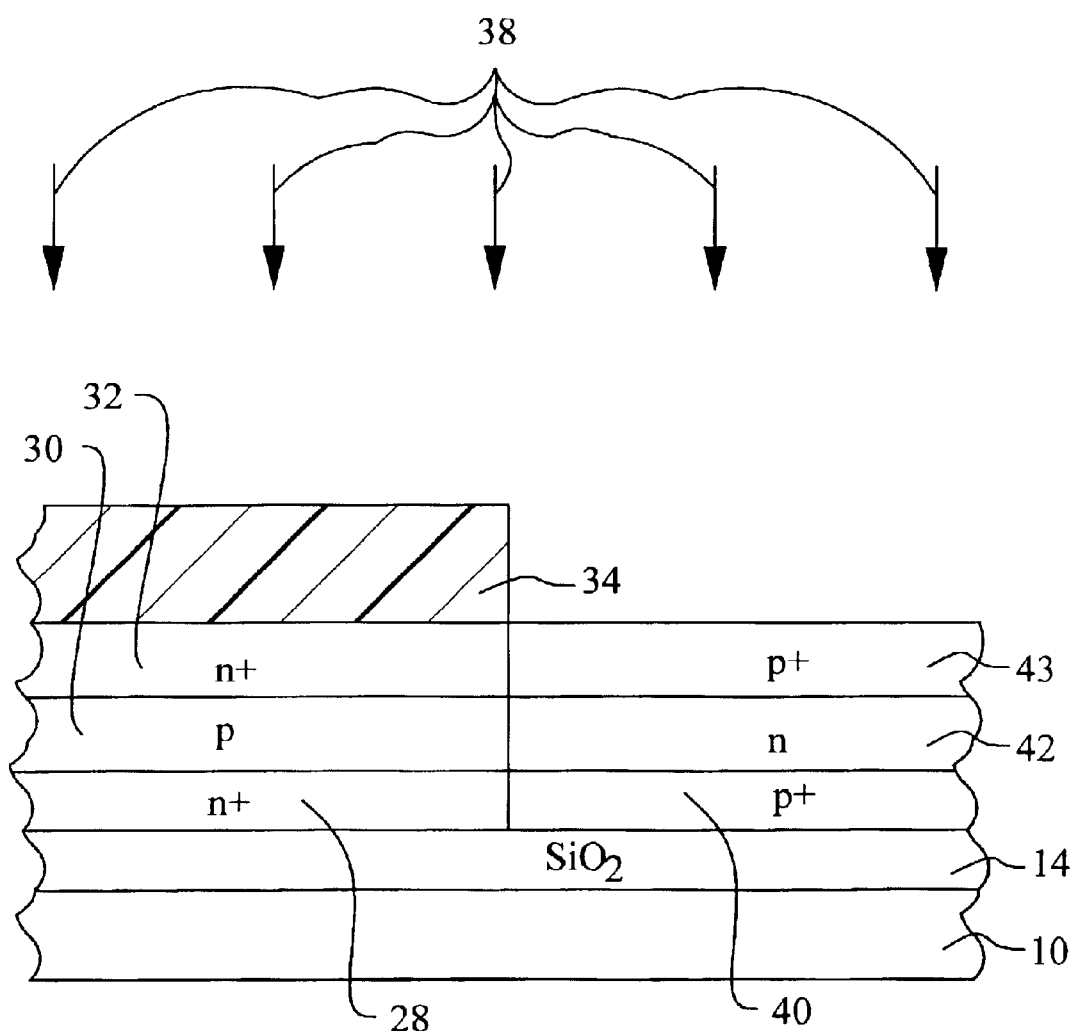

Referring now to FIG. 3, ions are selectively implanted 38 into the overlying silicon layer 18 to form a drain 40, a channel region 42, and a source 43, for the planned PMOS transistor. The technique is essentially the same as that used for the NMOS transistor. The overlying silicon layer 18 is first masked so that only the part of the overlying silicon layer 18 where the PMOS transistor is formed receives the implantation 38. A photoresist layer 34 may by applied and patterned using a conventional exposure and development process. The ion implantation preferably comprises a series of implantation steps using three recipes. In the drain recipe, ions are implanted 38 deeply into the overlying silicon layer 18 to form the p+ drain 40 just overlying the oxide layer 14. Further, the PMOS drain 40 is formed such that it is in contact with the NMOS drain 28. The drain ion implantation 38 preferably comprises implanting boron ions at an energy of between about 40 KeV and 90 KeV and a dose of between about $3 \times 10^{15}$ ions/cm$^2$ and $4 \times 10^{15}$ ions/cm$^2$. The PMOS transistor drain 40 so formed preferably comprises a thickness of its portion along its junction of between about 900 Angstroms and 1,000 Angstroms and a concentration of between about $1 \times 10^{20}$ ions/cm$^3$ and $1 \times 10^{21}$ ions/cm$^3$.

In the PMOS channel region recipe, ions are implanted 38 into the overlying silicon layer 18 to form the n-type channel region 42 overlying the p+ drain 40. The PMOS transistor channel region 42 so formed preferably comprises a thickness of between about 500 Angstroms and 1,000 Angstroms and a concentration of between about $1 \times 10^{17}$ ions/cm$^3$ and $5 \times 10^{18}$ ions/cm$^3$.

In the PMOS source recipe, ions are shallowly implanted 38 into the overlying silicon layer 18 to form the p+ source 43 overlying the channel region 42. The source ion implantation 38 preferably comprises implanting boron ions at an energy of between about 2 KeV and 4 KeV and a dose of between about $2 \times 10^{15}$ ions/cm$^2$ and $4 \times 10^{15}$ ions/cm$^2$. The PMOS transistor source 43 so formed preferably comprises a thickness of between about 800 Angstroms and 1,000 Angstroms and a concentration of between about $1 \times 10^{20}$ ions/cm$^3$ and $1 \times 10^{21}$ ions/cm$^3$. The remaining photoresist mask 34 is stripped away. Of particular importance to the present invention is the fact that the PMOS transistor drain 40 is formed adjacent to, and contacting, the NMOS transistor drain 28. This is a significant feature because it allows a common drain contact for the completed inverter device.

Figure 4:
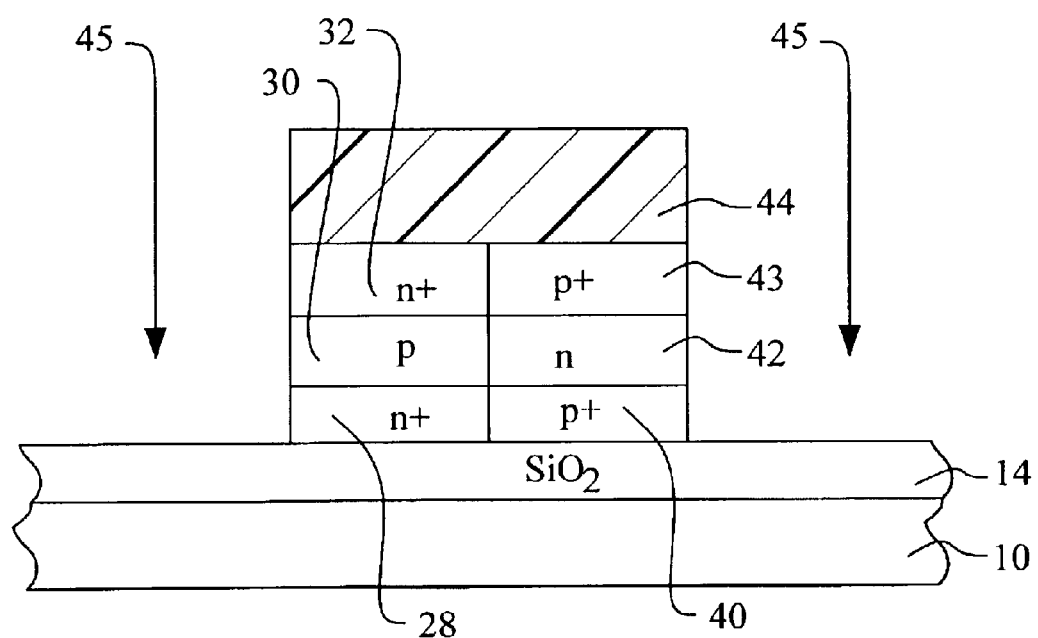

Referring now to FIG. 4, trenches 45 for shallow trench isolations (STI) are etched through the overlying silicon layer 18 to the oxide layer 14. A photoresist layer 44 may be used to define the active, or non-STI, regions.

Figure 5:
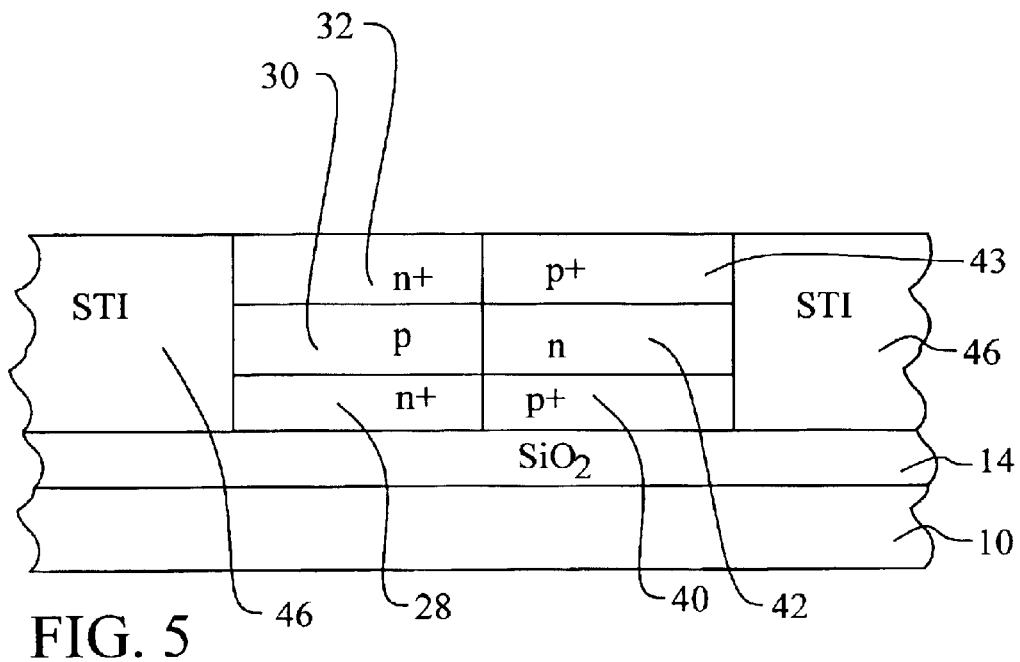

Referring now to FIG. 5, a dielectric layer 46 is deposited to fill trenches. The dielectric layer 46 is then polished down to remove unneeded material. The STI 46 complete the isolation of the overlying silicon layer for the planned CMOS inverter.

Figure 6:
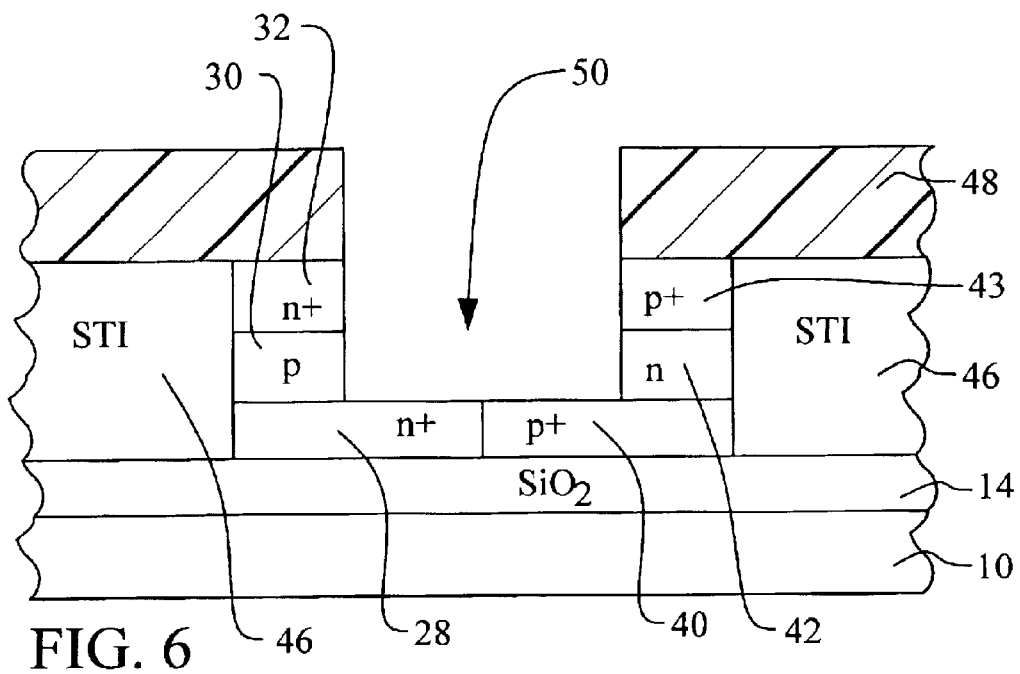

Referring now to FIG. 6, an important feature of the present invention is illustrated. A gate trench 50 is etched into the overlying silicon layer 18. The bottom of the gate trench 50 terminates at the top of the NMOS transistor drain 28 and the PMOS transistor drain 40. Note that the gate trench 50 splits the overlying silicon layer into an NMOS side and a PMOS side. The NMOS side corresponds to the remaining overlying silicon layer 18 above the NMOS transistor drain 28. The PMOS side corresponds to the remaining overlying silicon layer 18 above the PMOS transistor drain 40. The gate trench 50 is preferably etched using a dry plasma process and an etching mask 48.

Figure 7:
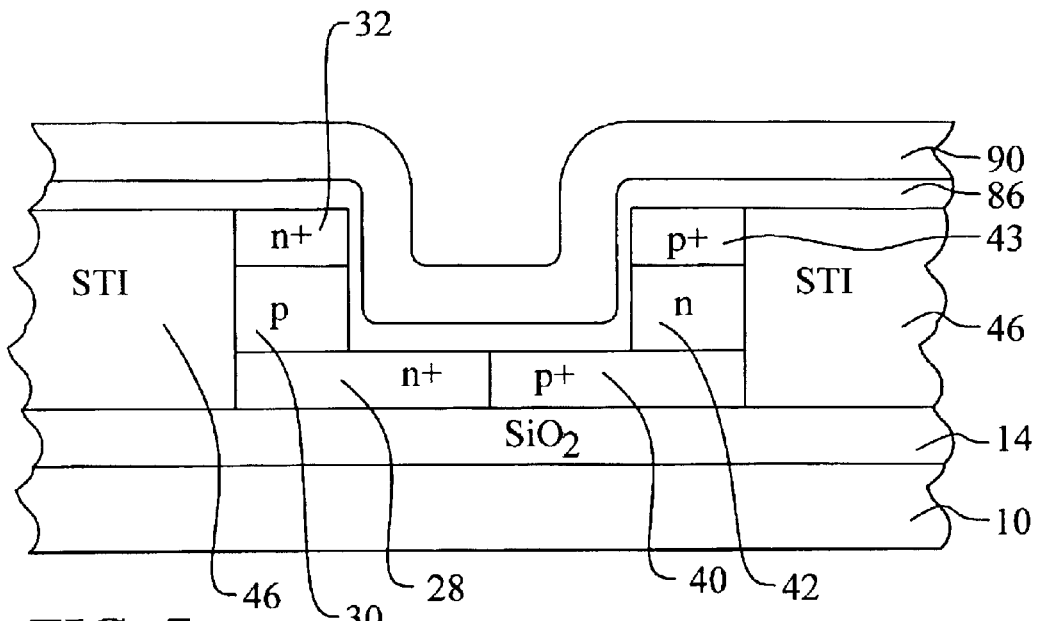

Referring now to FIG. 7, another important feature of the present invention is illustrated. A gate oxide layer 86 is formed overlying the NMOS source, channel region, and drain, 32, 20, and 28, and the PMOS source, channel region, and drain, 43, 42, and 40. The gate oxide layer 86 will form the gate dielectric for the completed CMOS transistor pair. The gate oxide layer 86 is preferably grown by a thermal oxidation process. Note that the thickness of the gate oxide layer 86 varies due to differing growth rates overlying the heavily doped regions 32, 28, 43, and 40 and adjacent to the lightly doped regions 30 and 42. The thickness of the gate oxide layer 86 adjacent to the channel regions 30 and 42 is the critical oxide thickness for the completed transistors. The gate oxide layer 86 is preferably formed Lo a thickness of between about 15 Angstroms and 20 Angstroms.

A polysilicon layer 90 is deposited overlying the gate oxide layer 86. The polysilicon layer 90 will form the gate node for the CMOS transistor pair. The polysilicon layer 90 is preferably deposited using a low-pressure CVD process with in-situ phosphorous (n-type) doping of about $1 \times 10^{21}$ atoms/cm$^3$. The polysilicon layer 90 is preferably deposited to a thickness of between about 800 Angstroms and 1,200 Angstroms.

Figure 8:
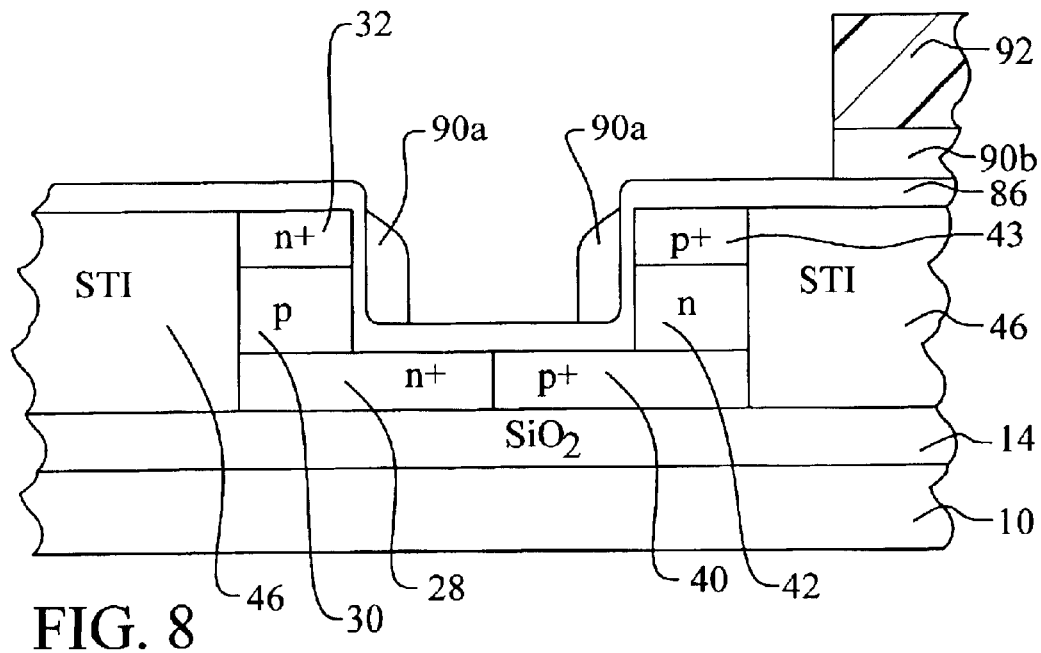

Referring now to FIG. 8, a particularly important feature of the present invention is shown. The polysilicon layer 90 is etched back to form polysilicon sidewall spcers 90a that, in turn, form gates 90a for the closely-spaced NMOS and PMOS transistor pair. A mask 92 may first be formed to protect the polysilicon layer in areas where polysilicon interconnect features 90b are needed. As will be discussed below, this mask 92 may be used to define connectivity to the transistor gates 90a. The etching process preferably comprises an anisotropic etch in a dry plasma process that attacks the polysilicon layer 90 selectively over the silicon dioxide of the gate oxide layer 86. The remaining polysilicon layer 90a adjacent to the NMOS channel region 30 and the PMOS channel region 42, with the gate oxide layer 86 therebetween, forms the transistor gates.

Figure 9:
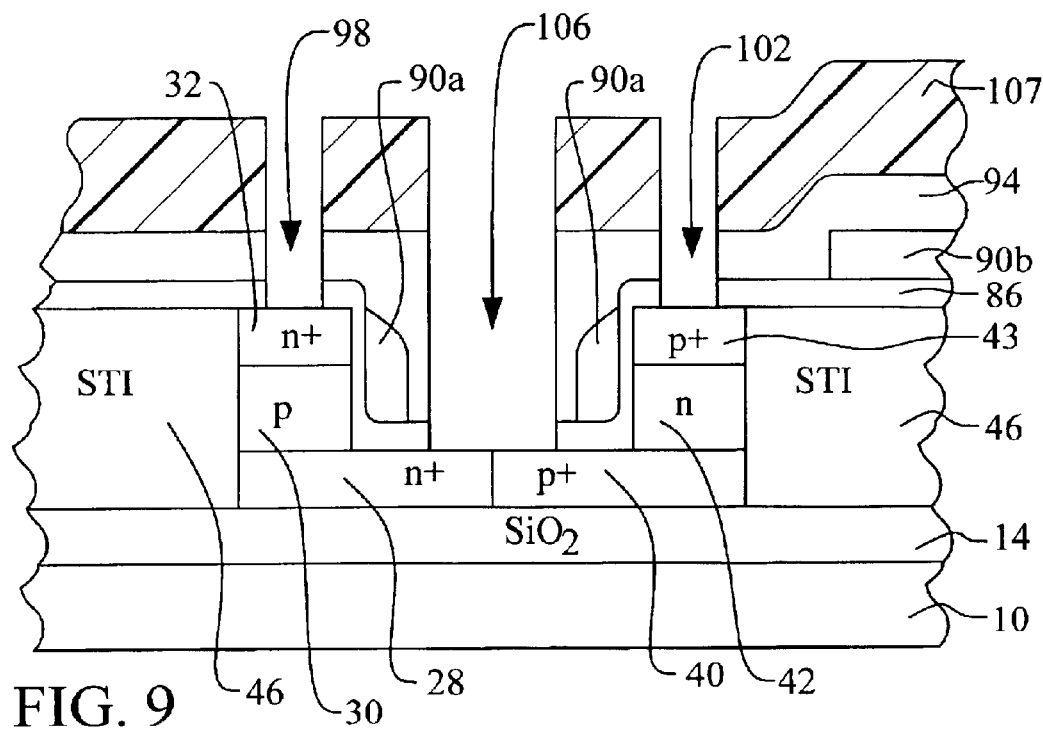

Referring now to FIG. 9, an interlevel dielectric layer (ILD) 94 is deposited overlying the closely-spaced, vertical NMOS and PMOS transistor pair. The purpose of the ILD layer 94 is to electrically isolate the subsequently formed contacts to the CMOS pair. The ILD layer 94 preferably comprises an isolation material, such as silicon dioxide, that is deposited by, for example, CVD. Following deposition, a polishing process, such as chemical mechanical polishing (CMP), is used to planarize the ILD layer 94.

Contact openings 98, 102, and 106 are then made through the interlevel dielectric layer 94 to expose the PMOS transistor source 43 and drain 40 and said NMOS source 32 and drain 28. These contact openings 98, 102, and 106 may be made using a dry plasma etch process with a masking layer (not shown). Note that the NMOS transistor drain 28 and the PMOS transistor drain 40 may be contacted using a single opening 106.

Figure 10:
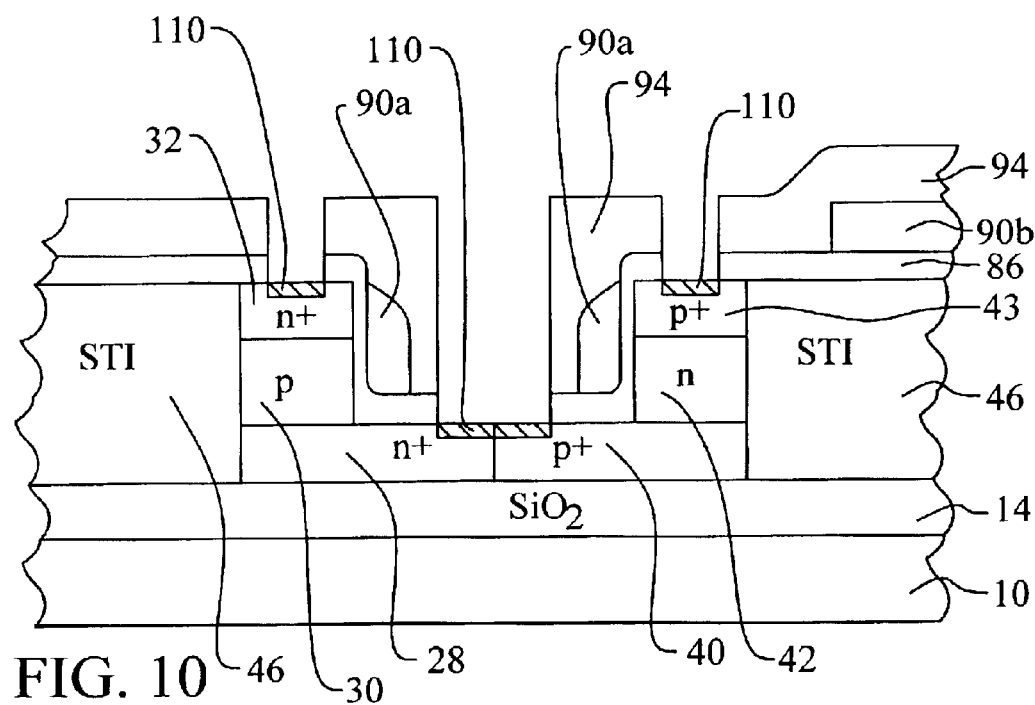

Referring now to FIG. 10, a metal silicide layer 110 is now formed on the NMOS transistor source 32 and drain 28 and the PMOS transistor source 43 and drain 40. Importantly, because of the presence of the interlevel dielectric layer 94 and the exclusive openings made in that layer, a self-aligned silicide (salicide) process may be used. In this process, a metallic layer, not shown, such as titanium (Ti) or Cobalt (Co), is deposited overlying the ILD layer 94 and lining the contact openings 98, 102, and 106. A sintering process is performed wherein the metallic layer reacts with the exposed overlying silicon layer 18 to form a metal silicide layer 110 in each contact opening. The presence of the metal silicide 110 reduces contact resistance and improves device performance. The remaining metallic layer is then removed using a wet chemical wash.

Figure 11:
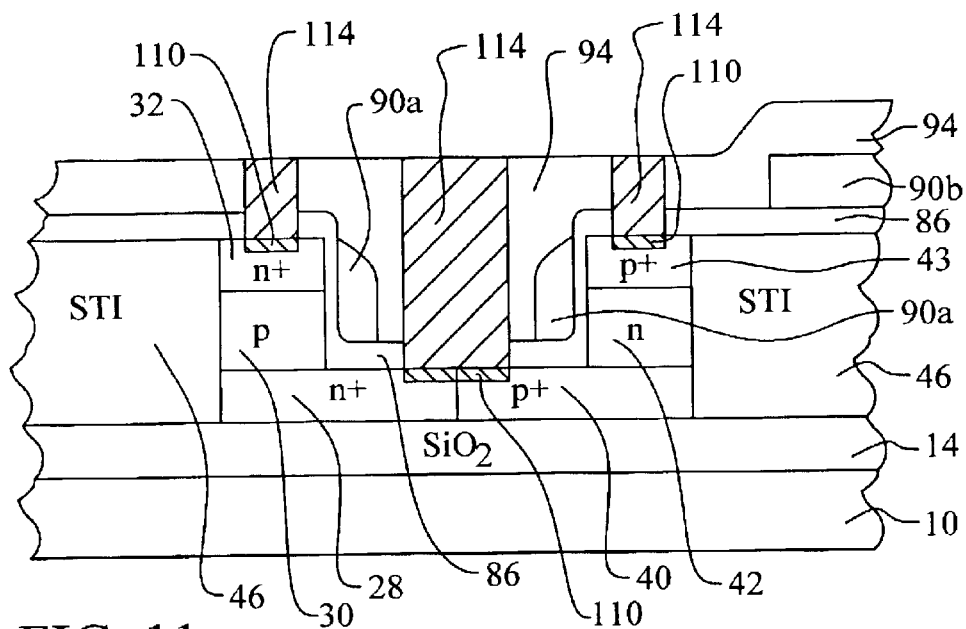
Figure 12:
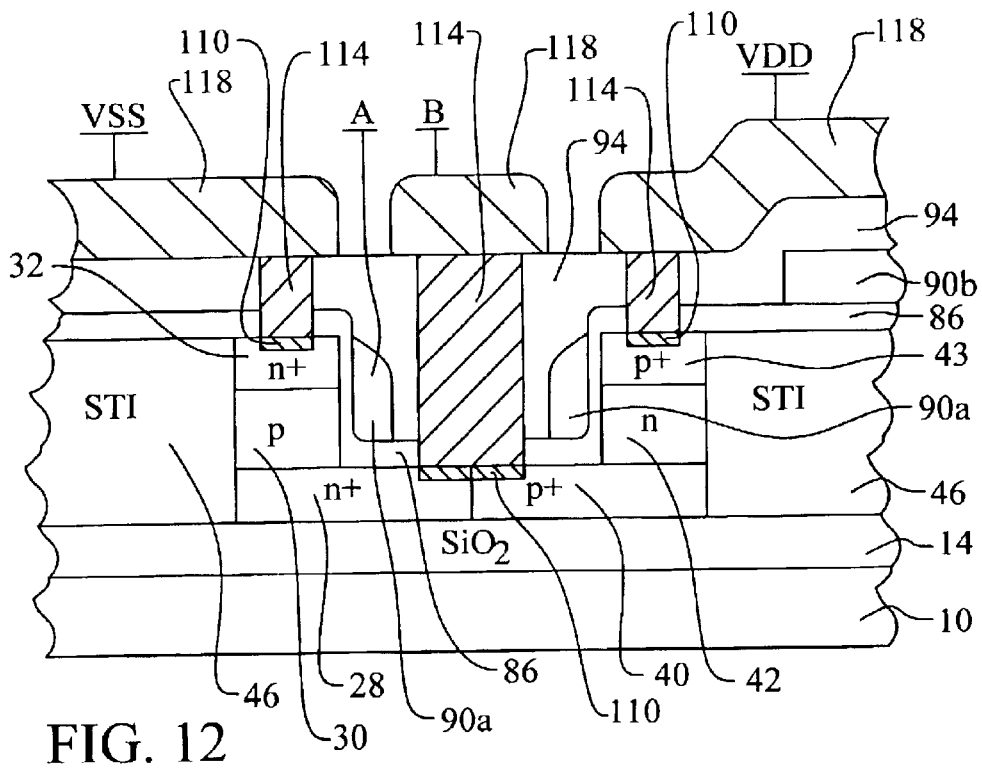

Referring now to FIGS. 11 and 12 a metal layer 114 and 118 is deposited to fill the openings 98, 102, and 106. This metal layer 114 and 118 preferably comprises a two-level combination of tungsten (W) plugs 114 and aluminum (Al) connective lines 118. First, referring particularly to FIG. 11, a tungsten layer 114 is deposited overlying the ILD layer 94 and filling the openings 98, 102, and 106. This tungsten layer 114 is then polished down using a CMP technique to define the tungsten plugs 114. Referring now to FIG. 12, an aluminum layer 118 is then deposited overlying the ILD 94 and the tungsten plugs 114. This aluminum layer 118 is then patterned by etching to define the connective lines 118.

Of particular importance to the present invention, the completed CMOS inverter has a very compact layout that utilizes vertical formation of the NMOS and PMOS transistors to reduce the layout area. The NMOS transistor source 32 may be easily connected to the VSS ground. The PMOS transistor source 43 may be connected to the VDD supply. The common drains 28 and 40 of the NMOS transistor and PMOS transistor are connected to the common output node B. The gates 90a of the CMOS transistor pair are connected to the common input node A.

Figure 13:
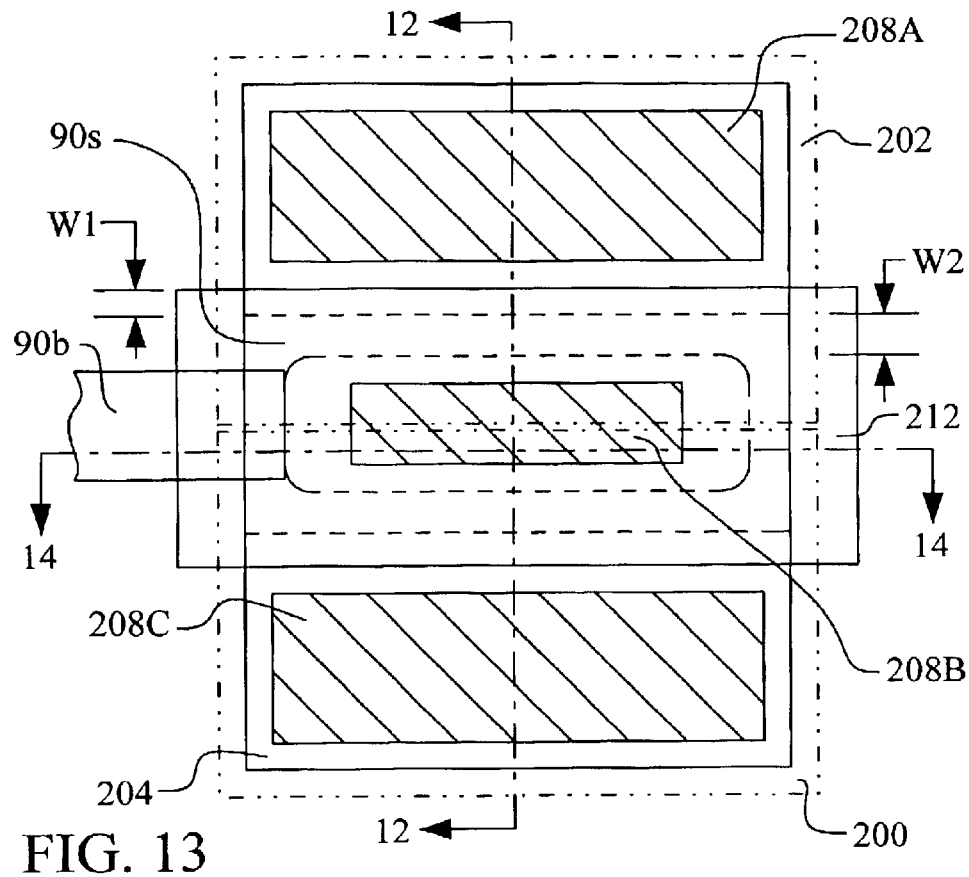
FIG. 13 illustrates a top layout view of the preferred embodiment of the present invention.

Referring now to FIG. 13, a top layout view of the preferred embodiment of the present invention is shown. An active mask 204, defines the active regions (inside) and the STI regions (outside). An NMOS source and drain mask 200 defines where the drain, channel region, and source implants are performed for the NMOS transistor. The PMOS source and drain mask 202 defines where the drain, channel region, and source implants are performed for the PMOS transistor. The gate trench mask 212 defines where the gate trench is etched. The gate oxide layer forms on the trench sidewalls to the thickness W1. The polysilicon sidewalls form to the thickness W2. The contact mask 208a, 208b, and 208c, defines the contact openings in the interlevel dielectric layer.

Figure 14:
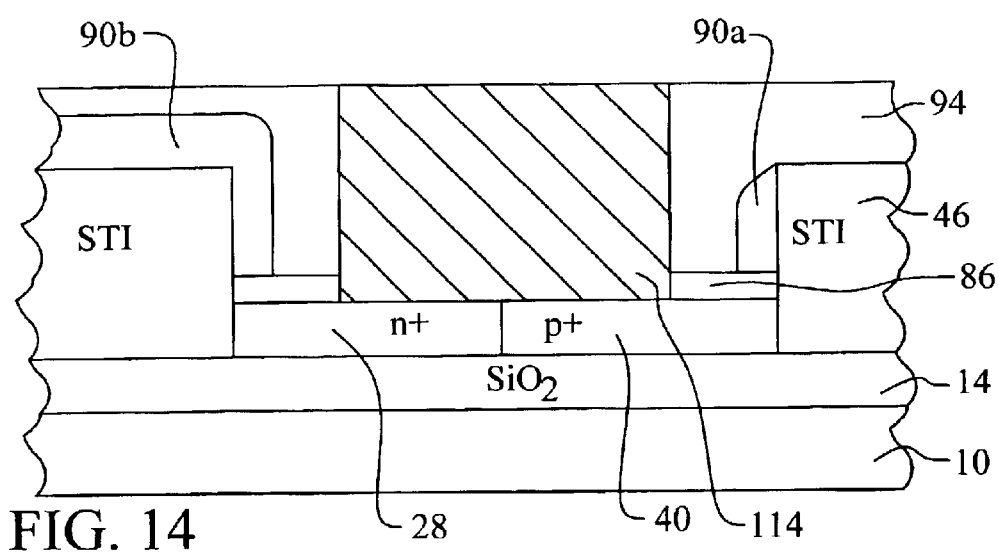
FIG. 14 schematically illustrate2 an alternative cross-sectional representation of the preferred embodiment of the present invention.

Referring to FIG. 14, an alternative cross section is shown. Note that the polysilicon feature 90b overlaps the sidewall of the trench in the direction perpendicular to the inverter. The polysilicon gates 90a are contacted by this polysilicon feature 90b that is formed using the polysilicon mask 22 and etch of FIG. 8.

Referring again to FIG. 12, the closely-spaced, vertical NMOS and PMOS transistor pair is shown comprising, first, a substrate comprising silicon implanted oxide wherein an oxide layer 14 is sandwiched between underlying and overlying silicon layers 10 and 18. A vertical NMOS transistor is in the overlying silicon layer 18. The vertical NMOS transistor comprises., first, a drain 28 overlying the oxide layer 18. A channel region 30 overlies the drain 28. A source 32 overlies the channel region 30. A gate trench exposes a top surface of the drain and a vertical surface of the channel region. Finally, a gate comprises a polysilicon sidewall spacer 90a adjacent to the vertical surface of the channel region 30 with a gate oxide layer 86 therebetween. A PMOS transistor is also in the overlying silicon layer 18. The PMOS transistor comprises, first, a drain 40 overlying the oxide layer 18. The drain 40 contacts the vertical NMOS transistor drain 28. A channel region 42 overlies the drain 40. A source 43 overlies the channel region 42. The gate trench exposes a top surface of the drain and a vertical surface of the channel region 42. Finally, a gate comprises a polysilicon sidewall spacer 90a adjacent to the vertical surface of the channel region with a gate oxide layer 86 therebetween to complete the PMOS transistor. The NMOS and PMOS transistor pair is connected by a metal layer 114 and 118 to complete the CMOS inverter device.

The advantages of the process of the present invention can now be enumerated. First, an effective process for forming CMOS inverters has been achieved. Second, the method allows very closely-spaced CMOS transistor pairs to be formed using vertical NMOS and PMOS transistors. Third, the use of a SIMOX substrate and STI regions allows the inverter device to be electrically isolated. Fourth, by forming the NMOS transistor on one side of the trench and the PMOS transistor on the other side of the trench, an efficient layout for the common drain contact is possible. Fifth, the method facilitates the use of salicide.

As shown in the preferred embodiment, the present invention provides a very manufacturable method and a novel device for providing vertical, closely-spaced CMOS inverters in the manufacture of an integrated circuit device.

While the invention has been particularly shown and described with reference to the preferred embodiments thereof, of will be understood by those skilled in the art that various changes in form and details may be made without departing from the spirit and scope of the invention.

What is claimed is:

1. A closely-spaced, vertical NMOS and PMOS transistor pair comprising:
    a substrate comprising silicon implanted oxide wherein an oxide layer is sandwiched between underlying and overlying silicon layers;
    a vertical NMOS transistor in said overlying silicon layer, said vertical NMOS transistor comprising:
        a drain overlying said oxide layer;
        a channel region overlying a part of said drain;
        a source overlying said channel region;
        a gate trench that exposes a top surface of said drain and a vertical surface of said channel region; and
        a gate comprising a polysilicon sidewall spacer adjacent to said vertical surface of said channel region with a gate oxide layer therebetween; and
    a vertical PMOS transistor in said overlying silicon layer, said PMOS transistor comprising:
        a drain overlying said oxide layer wherein said drain contacts said vertical NMOS transistor drain;
        a channel region overlying a part of said drain;
        a source overlying said channel region; and
        a gate trench that exposes a top surface of said drain and a vertical surface of said channel region;
        a gate comprising a polysilicon sidewall spacer adjacent to said vertical surface of said channel region with a gate oxide layer therebetween;
    an interlevel dielectric layer overlying said closely spaced, vertical NMOS and PMOS transistor pair, wherein said interlevel dielectric layer has openings that expose said PMOS source and drain and said NMOS source and drain;
    a metal silicide layer in said PMOS source and drain and said NMOS source and drain; and
    a patterned metal layer overlying said interlevel dielectric layer and said metal silicide layer.

2. The method according to claim 1 wherein said closely-spaced, vertical NMOS and PMOS transistor pair form a CMOS inverter.

3. The device according to claim 1 wherein said metal silicide layer consists of one of the group of: titanium silicide and cobalt silicide.

4. The device according to claim 1 wherein said overlying silicon layer comprises a thickness of between about 2,000 Angstroms and 3,000 Angstroms.

5. The device according to claim 1 wherein said NMOS transistor drain comprises a thickness of its portion along its junction of between about 900 Angstroms and 1,000 Angstroms and a dopant concentration of between about $1 \times 10^{20}$ ions/cm$^3$ and $1 \times 10^{21}$ ions/cm$^3$.

6. The device according to claim 1 wherein said NMOS transistor channel region comprises a thickness of between about 500 Angstroms and 1,000 Angstroms and a dopant concentration of between about $1 \times 10^{17}$ ions/cm$^3$ and $5 \times 10^{18}$ ions/cm$^3$.

7. The device according to claim 1 wherein said NMOS transistor source comprises a thickness of between about 800 Angstroms and 1,000 Angstroms and a dopant concentration of between about $1 \times 10^{20}$ ions/cm$^3$ and $1 \times 10^{21}$ ions/cm$^3$.

8. The device according to claim 1 wherein said PMOS transistor drain comprises a thickness of its portion along its junction of between about 900 Angstroms and 1,000 Angstroms and a dopant concentration of between about $1 \times 10^{20}$ ions/cm$^3$ and $1 \times 10^{21}$ ions/cm$^3$.

9. The device according to claim 1 wherein said PMOS transistor channel region comprises a thickness of between about 500 Angstroms and 1,000 Angstroms and a dopant concentration of between about $1 \times 10^{17}$ ions/cm$^3$ and $5 \times 10^{18}$ ions/cm$^3$.

10. The device according to claim 1 wherein said PMOS transistor source comprises a thickness of between about 800 and 1,000 Angstroms and a dopant concentration of between about $1 \times 10^{20}$ ions/cm$^3$ and $1 \times 10^{21}$ ions/cm$^3$.

11. The device according to claim 1 further comprising shallow trench isolations in said overlying silicon layer to isolate said closely-spaced, vertical NMOS and PMOS transistor pair from the remaining substrate.

* * * * *